United States Patent

Musa

[15] 3,676,801

[45] July 11, 1972

[54] STABILIZED COMPLEMENTARY MICRO-POWER SQUARE WAVE OSCILLATOR

[72] Inventor: Fuad H. Musa, Tempe, Ariz.

[73] Assignee: Motorola Inc., Franklin Park, Ill.

[22] Filed: Oct. 28, 1970

[21] Appl. No.: 84,602

[52] U.S. Cl. .......................................331/116 R, 58/23 AO

[51] Int. Cl. ........................................................H03b 5/36

[58] Field of Search ..................................331/116 R; 58/23

*Primary Examiner*—John Kominski

*Attorney*—Mueller and Aichele

[57] ABSTRACT

A square wave oscillator is shown utilizing a P channel and an N channel Metal-Oxide-Silicon Field Effect Transistor (MOSFET) in combination with a quartz crystal for generating a frequency stabilized square wave signal suitable for use in a wristwatch.

10 Claims, 10 Drawing Figures

Patented July 11, 1972 3,676,801

2 Sheets-Sheet 1

INVENTOR.
Fuad H. Musa
BY
Mueller & Aichele
ATTY'S.

INVENTOR.
Fuad H. Musa

BY

Mueller & Aichele

ATTY'S.

STABILIZED COMPLEMENTARY MICRO-POWER SQUARE WAVE OSCILLATOR

BACKGROUND OF THE INVENTION

Oscillators with square wave output signals are generally of the relaxation type in which the frequency is primarily determined by resistance-capacitance networks and the DC supply voltage. The frequency of operation of these oscillators, however, is very sensitive to environmental conditions (especially temperature) and variations in the supply voltage and, hence, are not suitable for applications where very stable frequencies of oscillation are required. In addition, these oscillators are not compatible with monolithic integration because of the small tolerances imposed on the magnitudes of the resistors and capacitors to produce predetermined frequencies of operation.

SUMMARY OF THE INVENTION

This invention relates to a frequency stable square wave oscillator which utilizes two complementary semiconductor devices known in the art as Metal-Oxide-Silicon Field Effect Transistors (MOSFETS). These devices are of the enhancement type and may have either metal or silicon gates.

It is an object of the present invention to provide a square wave oscillator circuit suitable for use in a wristwatch for measuring time.

It is one object of this invention to provide a square wave oscillator in which the frequency of oscillation is crystal controlled. The extremely high loaded Q of the oscillator, which is virtually equal to the unloaded Q of the crystal, results in excellent frequency stability.

It is another object of this invention to provide an oscillator in which the frequency is virtually insensitive to DC voltage or resistive and capacitive magnitude variations.

A further object is to provide an oscillator which is capable of operating from a very low DC supply voltage at extremely low DC current drain.

Another objective is to provide an oscillator in which all the components except the crystal are amenable to complementary MOSFET monolithic integration.

Still another object is to provide an oscillator in which the amplitude of the output signal is virtually equal to the DC supply voltage at all possible frequencies without any adjustments of components.

Yet another object is to provide an oscillator which is capable of oscillating over several decades of crystal frequencies without any adjustments of components.

A still further object of this invention is to devise an oscillator which is capable of producing complementary square wave output signals.

These and other objects and features of this invention will become fully apparent in the following description of the accompanying drawings, wherein:

FIGS. *1a* and *1b* are circuit diagram designations of a P and an N channel MOSFETS, respectively;

BRIEF DESCRIPTION OF THE INVENTION

The present invention contemplates the employment of a C-MOSFET inverter as the transistor portion of a stable crystal oscillator. No components are required which have critical tolerances and only a minimum number of such components are used. In the circuit configuration shown having one inverter stage, one or both of the MOSFETS are turned on and then one or both of the MOSFETS must have a small signal gain at the desired frequency of oscillation which is in excess of unity. A second embodiment includes frequency trimming and temperature stabilizing capacitors. A third embodiment further includes a second inverter stage identical to the first stage for making available complementary output signals. A fourth embodiment employs three stages for achieving increased gain and for achieving oscillation at higher frequencies.

DETAILED DESCRIPTION OF THE INVENTION

Throughout the several Figures, the same numeral is used to identify the same component.

Figure 1A:
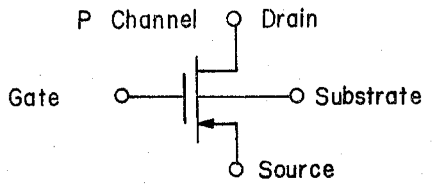
Figure 1B:
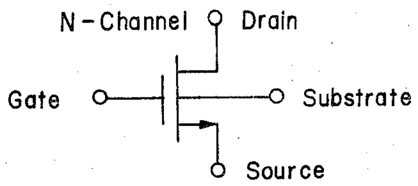

Referring to FIG. 1B, there is shown an N channel MOS field effect transistor. The transistor conducts current between its drain and source, when the following two conditions are satisfied: First, the drain is at a positive potential with respect to the source; and second, the gate to substrate potential is positive and the gate to substrate voltage exceeds a certain voltage called a threshold voltage of that N channel device.

Referring to FIG. 1A, there is shown a P channel MOS field effect transistor. The P channel device operates in substantially the same way as the N channel device. This transistor conducts current between its source and drain, when the following two conditions are satisfied: First, the drain is at a negative potential with respect to the source; and second, the gate is at a negative potential with respect to the substrate and this gate to substrate potential should exceed in magnitude a certain voltage called a threshold voltage of this device.

Figure 2:
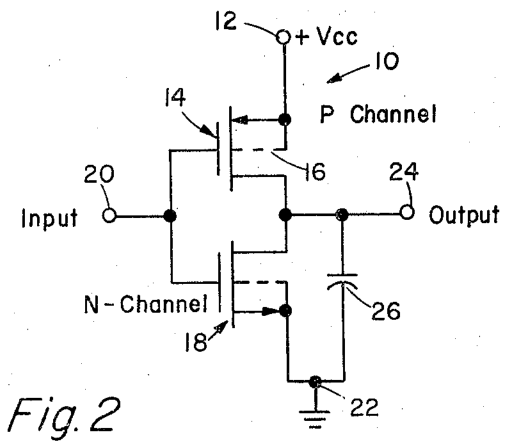
FIG. 2 is a circuit diagram of a complementary MOSFET inverter.

These two devices are connected in the fashion shown in FIG. 2 for forming a MOS complementary inverter 10. The performance of this complementary inverter could be described as follows: A positive potential source 12 is connected to the source electrode of a first P channel MOSFET 14. A dotted line 16 indicates that the substrate of the MOSFET 14 is connected to the potential source 12. The gate electrode of the P channel MOSFET 14 is connected to the gate electrode of an N channel MOSFET 18 and both gate electrodes are connected to an input terminal 20. The substrate of the MOSFET 18 and the source of the same MOSFET 18 are connected to ground potential available at the terminal 22. The drain of the MOSFET 14 and the drain of the MOSFET 18 are connected together and are both connected to an output terminal 24. The capacitance value of the load attached to the output terminal 24 is represented by a capacitor 26 connected between the terminals 20, 22 and 24.

The operation of the MOS complementary inverter is as follows: As the DC supply potential is first applied to the inverter, shown in FIG. 2, the voltage level available at the output terminal 24 lies between zero potential and the level of the supply potential. This level is set by the values of the internal capacitances of the MOSFETS 14 and 18 and the value of the capacitor 26. If the input terminal 20 is set at a zero potential, the gate to substrate voltage on the transistor 14 is equal to minus the supply voltage. If the supply voltage is greater than the absolute value of the threshold voltage of the P channel transistor 14 and since a positive potential has been established between the source and drain of the transistor, then the transistor 14 conducts. However, in the configuration shown and with the potential 12 and 22 as described, the gate to substrate potential of the transistor 18 is zero and therefore the N channel transistor 18 is turned off. Therefore, the current flow in the P channel transistor 14 has only one path and that is for charging the output capacitor 26 to the level of the supply potential 12. When the potential at terminal 24 becomes equal to the supply voltage, then the source-drain potential of MOSFET 14 is zero and accordingly, MOSFET 14 turns off. This condition corresponds to Time To in FIG. 8.

It can be seen that at time T1 a step function is applied to terminal 20, and the amplitude of this step function is equal to the supply potential 12. At time T1, the gate to substrate voltage on the P channel transistor 14 is equal to zero volts, since both terminal 20 and the substrate of the P channel transistor 14 are both held to the supply potential 12 and therefore MOSFET 14 remains off. However, the gate to substrate voltage on the N channel transistor 18 is equal to the supply voltage and since this supply voltage is in excess of the threshold voltage of this N channel transistor 18 and since the drain to source potential of the transistor 18 is positive and equal to the supply potential, then this N channel transistor conducts. Since the P channel device 14 is off, then the conduction of the de ice 18 provides a path for the charge on the capacitor 26 to discharge to ground potential. At this time, the drain to source voltage of the N channel transistor 18 becomes zero and therefore the N channel transistor 18 turns off. Therefore, current only flows when either the P channel transistor 14 is on for charging the capacitor 26 to the supply voltage, or when the N channel device is on for providing a path for the capacitor 26 to discharge to ground potential. Therefore, power is only dissipated during switching. When the input voltage at the terminal 20 is at ground potential such as TO in FIG. 8, the output voltage at terminal 24 is set to the supply voltage.

Figure 8:
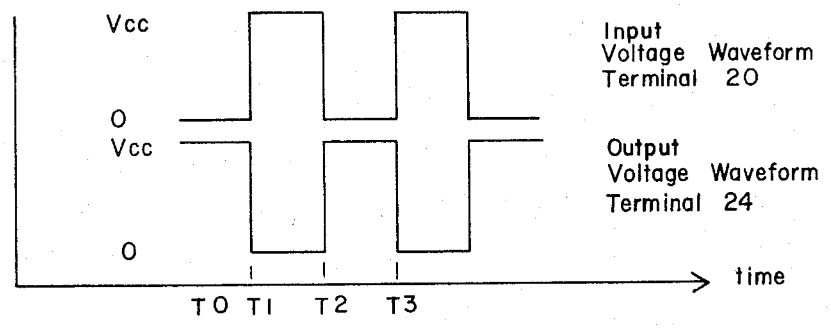
FIG. 8 shows input and output wave forms of a complementary MOSFET inverter.

When the input voltage at the terminal 20 is at supply potential, such as at T1 in FIG. 8, the output voltage at terminal 24 is set at ground potential, thus giving the signal inversion between input and output. When a train of pulses are applied to the input terminal 20, having upper and lower potentials equal to supply potential and ground potential, respectively, the voltage waveform at the output terminal is shown in FIG. 8.

Figure 3:
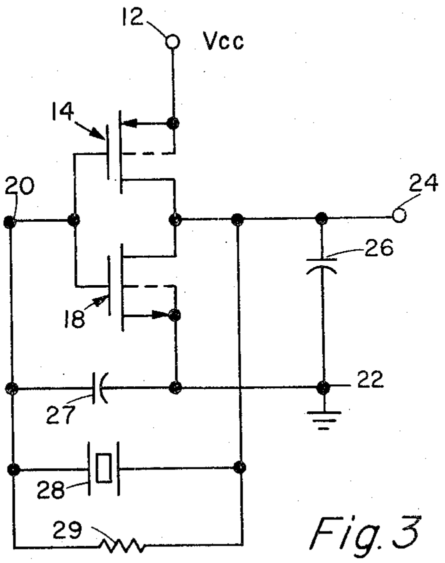
FIG. 3 is a crystal controlled square wave oscillator circuit.

Referring to FIG. 3, there is shown a schematic view of an oscillator circuit comprising the complementary inverter circuit of FIG. 2 and a capacitor 27 connected between the common gates of the transistors 14 and 18 and ground potential. A crystal 28 and a resistor 29 are connected in parallel and the parallel connection of these devices are connected between the common drains and common gates of the transistors 14 and 18.

The crystal sets the frequency of oscillation of the circuit and can have any value well known in the prior art. The resistor 29 operates as a starting mechanism for ensuring that the inverter is not initially latched in a static state whereby one of the MOSFETS stays on while the other MOSFET stays off and when the closed loop gain is less than unity. The magnitude of resistor 29 lies in the range between $1 \times 10^7$ to $1 \times 10^{11}$ ohms. The capacitors 26 and 27 are primarily used for providing the proper DC bias whereby the MOSFETS 14 and 18 are capable of enough small signal gain for allowing continued oscillation.

Figure 4:
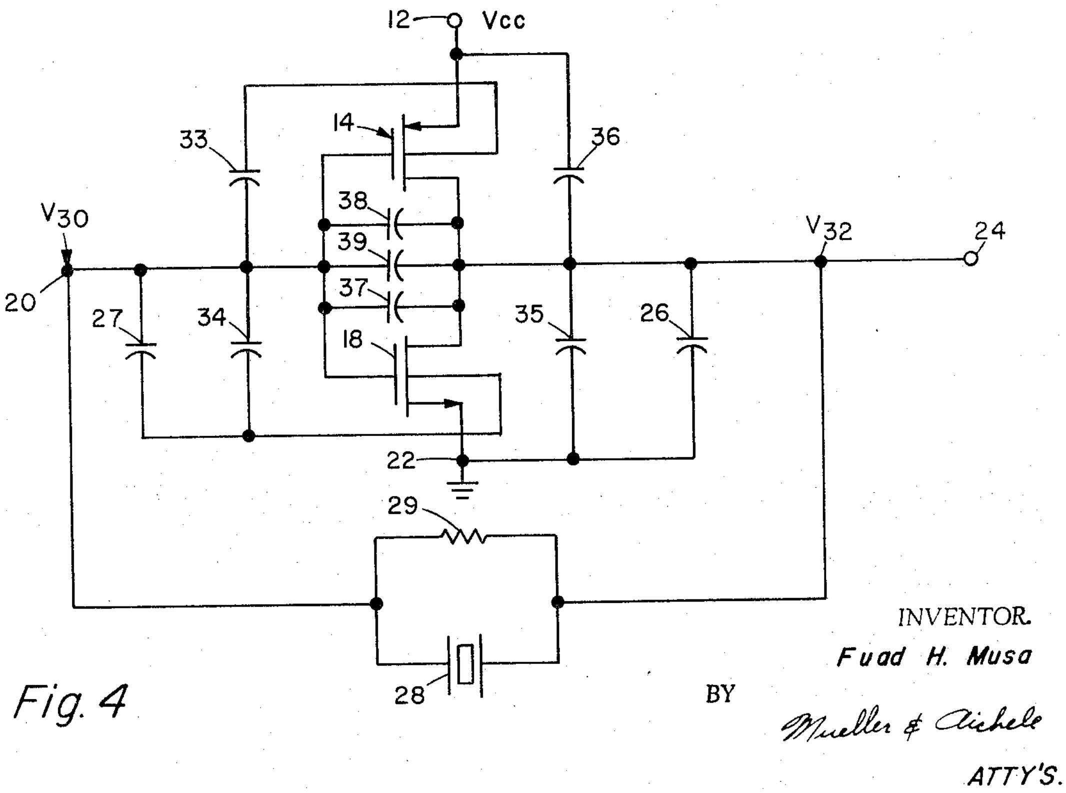
FIG. 4 is the oscillator of FIG. 3 with all MOSFET capacitances drawn externally.

FIG. 4 shows the oscillator circuit of FIG. 3 with all the internal MOSFET capacitances drawn external to the devices. With all capacitors connected electrically in the fashion shown in FIG. 4, then as a DC supply voltage at 12 is applied, voltages 30 and 32 are (initially) established at input and output terminals 20 and 24 respectively, by the magnitudes of the capacitors 26 and 27, and capacitors 33 through 39, with capacitor 39 representing the parallel capacitance of the crystal. The voltage potentials at nodes 20 and 24 are initially set such that either one or both MOSFET devices 14 and 18 are turned on. In each case, however, one of the transistors 14 and 18 or both must have a small signal gain at the desired frequency in excess of unity for allowing the oscillation to continue.

Table I shows the relationships between voltages at nodes 20 and 24, the supply potential, and the threshold voltages of the devices 14 and 18 respectively, which satisfy the above conditions. In all cases, the supply potential is greater than the magnitude of the threshold voltage of the P channel device 14 and the threshold voltage of the N channel device 18.

TABLE I

| $V_{30}$ | $V_{32}$ | $V_{30}-V_{cc}$ | N Channel | P Channel |
|---|---|---|---|---|
| $>V_{th_N}$ | $>0$ | $<\lvert V_{th_p}\rvert$ | On | Off |
| $<V_{th_N}$ | $<V_{cc}$ | $>\lvert V_{th_p}\rvert$ | Off | On |
| $>V_{th_N}$ | $>0$ & $<V_{cc}$ | $>\lvert V_{th_p}\rvert$ | On | On |

The equations below describe mathematically these voltage relationships with respect to the magnitudes of capacitors 33 through 39, being the internal capacitance values, and the DC bias setting capacitors 26 and 27.

$$V_{30}=\frac{V_{cc}}{1+\frac{(C_{27}+C_{34})(2C_{35}+C_{26})+(2C_{37}+C_{39})(C_{35}+C_{26}+C_{27}+2C_{34})}{C_{34}(2C_{35}+C_{26})+(2C_{37}+C_{39})C_{35}}}$$

$$V_{32}=\frac{V_{cc}}{\frac{(C_{35}+C_{26})(2C_{34}+C_{27})+(2C_{37}+C_{39})(C_{34}+C_{26}+C_{27}+2C_{35})}{C_{35}(2C_{34}+C_{27})+(2C_{37}+C_{39})C_{34}}}$$

With the exception of capacitors 26 and 27, all capacitance values shown in FIG. 4, are fixed being either MOSFET or crystal capacitances. Therefore, the voltage at nodes 20 and 24 are initially set for satisfying one of the conditions in Table I, by properly adjusting the magnitude of capacitors 26 and 27. For an example, if the DC supply voltage is less or equal to the sum of threshold voltage of the N channel transistor 18 plus the absolute value of the threshold voltage of the P channel transistors 14, $$[V_{cc} \leqq (V_{th_N} + |V_{th_p}|)]$$

then if capacitors 26 and 27 are much larger in magnitude than either the internal capacitance of the MOSFET, or the crystal parallel capacitance, then the P channel transistor 14 is turned on and the N channel transistor 18 is turned off. In addition to setting the proper DC biasing conditions, the capacitors 26 and 27 also have the proper magnitudes which allow oscillation at the desired frequency by allowing the network determinant to go to zero at that frequency as is hereinafter described in greater detail hereinafter. Capacitors 26 and 27 are also utilized as frequency trimming elements. Increasing the magnitude of either capacitor 26 and 27 or both, shifts the frequency of oscillation away from the parallel resonant value towards the series resonance frequency of the crystal. Reducing the magnitudes shifts the frequency of oscillation in the opposite direction.

Figure 5:
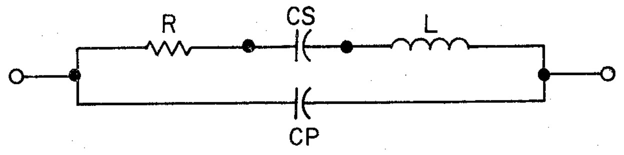
FIG. 5 shows the electrical equivalent circuit of the crystal.

Referring briefly to FIG. 5, there is shown in FIG. 5 the equivalent circuit of the crystal 28 which configuration is used in the calculation shown hereinafter. $C_p$ is the crystal parallel capacitance. Cs is the crystal series capacitance. R is the crystal resistance and L is the crystal inductance.

Once the MOSFETS are properly biased, then one of several techniques can be utilized to determine the starting conditions and the frequency of oscillation. The method described below utilizes the matrix approach. In particular, the short-circuit admittance (Y) matrix will be utilized. It can be shown that the two-part Y parameters describing the oscillator shown schematically in FIGS. 3 and 4 and utilizing the crystal equivalent circuit shown in FIG. 5 are:

$$Y_{11}=Y_i+Y+1/R_{29}$$
$$Y_{12}=-(Y+1/R_{29})-S(C_{37}+C_{38})$$
$$Y_{21}=G_m-(Y+1/R_{29})-S(C_{37}+C_{38})$$
$$Y_{22}=G+Y+(Y+1/R_{29})$$

where $$Y_i=S(C_{27}+C_{33}+C_{34}+C_{37}+C_{38})$$
$$Y_0=S(C_{26}+C_{35}+C_{36}C_{37}+C_{38})$$
$$Y=\text{admittance of crystal}=\frac{S^3LC_sC_{39}+S^2RC_sC_{39}+S(C_s+C_{39})}{S^2LC_s+SRC_2+1}$$

$G_m$ = sum of the transconductances of the n- and p- channel MOSFETS $G$ = the sum of the drain to source conductances of the n- and p- channel MOSFETS $S$ = complex frequency = $\sigma+jw$ The starting conditions and frequency of oscillation can be determined from $$\begin{vmatrix} Y_{11} & Y_{12} \\ Y_{21} & Y_{22} \end{vmatrix} = Y_{11}Y_{22}-Y_{12}Y_{21}=D^{\Delta}Y=0$$

$\overset{\Delta}{D}Y$ is a function of the complex frequency S ($S=\sigma+jw$). To guarantee stable oscillations, only one complex root of $\overset{\Delta}{D}Y=0$ should have a positive $\sigma$ ensuring start of oscillation and a positive $jw$ which is the radian frequency of oscillation (frequency = $w/2\pi$).

When this matrix analysis was performed on the oscillator circuit shown in FIGS. 3 and 4, it was found that it will oscillate at an intermediate frequency between series and parallel resonance frequencies of the crystal. At the frequency of oscillator, the crystal has an inductive impedance which guarantees a regenerative feedback path from the output to the input of the inverter. It was also found that when the MOSFETS have transconductances of the order of $10^{-5}$ mho, the same capacitive components will guarantee oscillation between 5KH$_z$ and several hundred KH$_z$.

Figure 6:
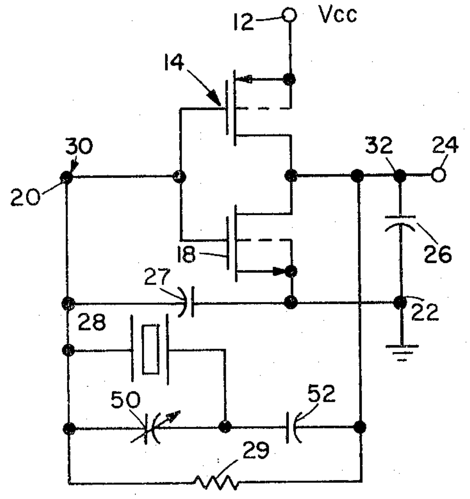
FIG. 6 is a crystal controlled oscillator with frequency trimming and temperature compensating mechanism.

The oscillator circuit shown schematically in FIG. 6 is another embodiment of this invention. In applications where extremely small tolerances are forced on the frequency of oscillation and also where extremely stable frequencies are required, such as extremely accurate electronic watch crystal oscillator, frequency trimming and temperature compensating elements become necessary. In the oscillator of FIG. 6, the variable capacitor 50 is a frequency trimming mechanism which varies the frequency of oscillation by a very small fraction of the crystal resonant frequency. Capacitor 52, placed in series with the crystal 28, serves both as a temperature frequency stabilizing mechanism and also as frequency trimming element. This capacitor is made with a dielectric material such as ceramic plus barium titinate having a very high dielectric constant. Such a ceramic capacitor has a temperature coefficient of several thousand per degree centigrade coefficient which coefficient swings from positive to negative over a wide temperature range. The function ascribed to the capacitors 50 and 52 can be performed by either or both capacitors together or the function of each interchanged capacitor as described hereinabove can be reversed.

For a frequency range lying TKH$_z$ to 300 KH$_z$ the value of capacitors 50 and 52 lie in the range between 1 pf to 10 pf.

Figure 7:
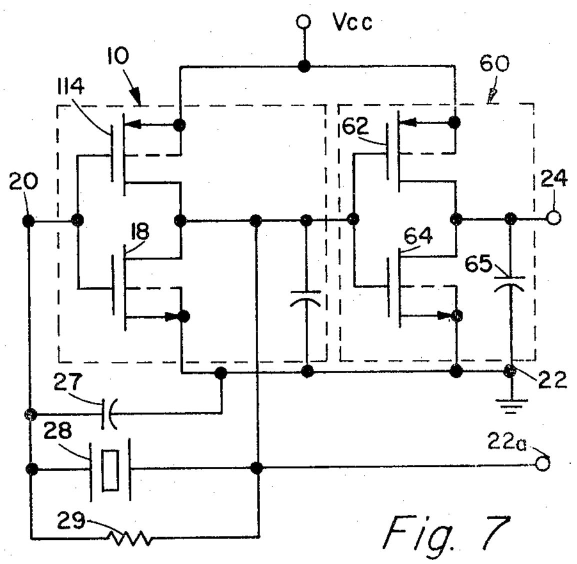
FIG. 7 shows a circuit schematic for an oscillator which provides complementary output signals.

Another embodiment of this invention is the oscillator circuit shown schematically in FIG. 7. This circuit is capable of producing complementary square wave output signals. Such circuit can be utilized in synchronous logic circuits. The circuit in FIG. 7 utilizes the oscillator shown in FIG. 3 in addition to a second stage 60 comprising a pair of complementary MOSFETS 62 and 64 which are electrically connected as an inverter. A capacitor 65 represents the load capacitance comprising the input capacitance of the network which is being driven by this oscillator. The value of the capacitor 65 depends upon the type of circuit driven and is ascertainable by those skilled in the art. For best understanding of the performance of this circuit, the following description should be read in conjunction with FIGS. 7 and 8. For simplicity, all wave forms are assumed to consist of step functions.

The input signal applied to the terminal 20a, shown in FIG. 7, is shown in FIG. 8, are the output waveform of the oscillator shown in FIG. 3. The waveform appearing at terminal 24 is complementary to that available at terminal 20a, as shown in FIG. 8, and is obtained by similar description of the performance of the complementary inverter shown in FIG. 2.

Figure 9:
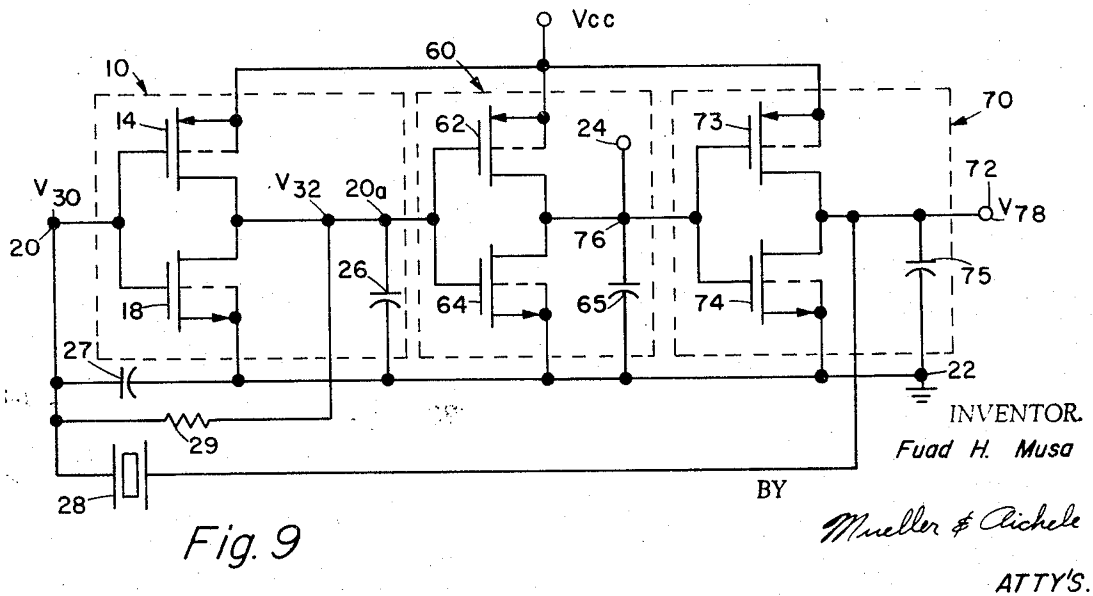
FIG. 9 is a circuit schematic of a crystal controlled, square wave oscillator with high frequencies of oscillation and complementary output capabilities.

The oscillator circuit shown schematically in FIG. 9 is yet another embodiment of this invention. This oscillator operates on the same principles as those discussed above for the oscillator shown in FIGS. 3 and 7. In this circuit, however, the open loop small signal gain is much larger than the gain achieved by the circuits shown in FIGS. 3 and 7. The higher loop gain allows this circuit to oscillate at higher frequencies. The crystal in FIG. 9 is connected between the output of a third complementary inverter 70 at terminal 72 and the input of the first inverter at terminal 20. The third stage 70 comprises a P channel MOSFET 73 and an N channel MOSFET 74 connected electrically as a complementary inverter. At the frequency of oscillation, the crystal has an inductive impedance, thus producing the phase inversion necessary for regenerative feedback. By the same principle described above in connection with the circuit of FIG. 7, complementary square wave output signals are available at terminals 24 and 72.

Referring to FIG. 9, the capacitors 26, 27 and 65 and a capacitor 75 connected between the output terminal 72 and ground, are partially used as biasing elements in a manner similar to that which was described for the oscillator circuit of FIG. 3. The voltages $V_{30}$, $V_{32}$ and voltage $V_{76}$ at the output of the second stage 60, and voltage $V_{78}$ at the output off the third stage 71, are set initially such that the closed loop small signal gain of the three stage system is in excess of unity for permitting the start of oscillation. As the DC supply voltage is turned on, $V_{38}$, $V_{40}$, $V_{76}$ and $V_{78}$ are determined by the magnitudes of capacitors $C_{26}$, $C_{27}$, $C_{65}$, and $C_{75}$ and by the internal capacitances of the N and P channel devices and the crystal parallel capacitance. If all MOSFETS are initially turned on under conditions that $V_{cc}$ is greater than the sum of the threshold voltages of the N and P channel MOSFETS or if at least one transistor in each of the three stages 10, 60 and 70 is turned on, then a small signal gain can be established between terminals 20 and 72. If $V_{cc}$ is less than $V_{th_N}+|V_{th_p}|$, then one of two possible biasing conditions occurs depending on the magnitudes of the capacitors in the network. In one case MOSFETS 14, 64 and 73 are on and MOSFETS 18, 62 and 74 are off. In the other case MOSFETS 18, 62 and 74 are on and MOSFETS 14, 64 and 73 are off. In both cases, however, capacitors 27 and 26 are the determining factor in setting the biasing conditions. For example, of capacitors 27 and 26 are much larger than the MOSFETS' capacitances, $V_{30}$ and $V_{32}$ are virtually set at ground potential. Therefore MOSFET 18 is off because it has a very small gate to substrate voltage. The P channel MOSFET 14, however, has a positive potential between source and drain and also has a gate to substrate voltage approximately equal to $-V_{cc}$. MOSFET 14, therefore, turn on and charges capacitor 26 to the supply voltage wherein $V_{32}$ becomes equal to $V_{cc}$. Since initially capacitor 65 establishes a positive potential between the drain to source of MOSFET 64 and since the gate to substrate voltage of this device is now equal to $V_{cc}$, MOSFET 64 turns on. MOSFET 62, however, has a very small gate to substrate voltage and, therefore, is off. This allows capacitor 65 to discharge through the drain to source conductance of MOSFET 64 bringing $V_{76}$ close to ground potential. MOSFET 74 is now off because of the very small gate to substrate voltage. MOSFET 73, however, has a gate to substrate voltage equal to $-V_{cc}$, and since capacitor 74, through voltage division, has established a positive potential between the source and drain of MOSFET 73, this device turns on and charges capacitor 75 to the supply voltage. Therefore, when capacitors 27 and 26 are large, since capacitors 65 and 75 allow $V_{76}$ and $V_{78}$ to be initially positive, MOSFETS 14, 64 and 73 are turned on, and MOSFETS 18, 62 and 74 are turned off. In addition to being biasing elements, capacitors 27, 26, 65 and 75 must have the proper magnitudes to allow for oscillation. Also capacitors 27 and 75 can be utilized as frequency trimming elements.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An oscillator circuit of the type including complementary metal-oxide-semiconductor; field-effect-transistors (MOSFET), comprising:
a source of potential having at least a first level of potential and a second level of potential,
a first, enhancement mode MOSFET having source, drain, gate, and substrate electrodes,
a second, enhancement mode MOSFET having source, drain, gate, and substrate electrodes,
said substrate electrode of each MOSFET being connected to said source electrode of said same MOSFET,
an output terminal,
said source electrode of said first MOSFET being connected to said first level,
an output capacitor participating in the establishment of a bias potential and having a first end and a second end and being connected to said second level by said second end,
said drain electrodes of said first and second MOSFETS being interconnected at a first junction with said first end of said output capacitor for providing a charging path for said output capacitor through said first MOSFET and for providing a discharging path for said output capacitor through said second MOSFET,
said gate electrodes being interconnected and forming a second junction,
an input capacitor being connected between said second junction and said second level for participating in the establishment of a bias potential for said drain electrodes,
said source electrode of said second MOSFET being connected to said second level,
a crystal for setting the frequency of oscillation is connected between said first and second junctions, and
a starting resistor is connected between said first and second junctions for ensuring that the interconnected first and second MOSFETS are not initially latched in a static state.

2. An oscillator circuit as recited in claim 1, wherein:
said first MOSFET is a P channel MOSFET,
said second MOSFET is an N channel MOSFET, and
said second level of said potential source is lower than said first level.

3. An oscillator circuit as recited in claim 1, wherein:
said first MOSFET is an N channel MOSFET,
said second MOSFET is a P channel MOSFET, and
said second level of said potential source is greater than said first level.

4. An oscillator circuit as recited in claim 2, and further comprising:
a third P channel, enhancement mode MOSFET having source, drain, gate, and substrate electrodes,
a fourth N channel, enhancement mode MOSFET having source, drain, gate and substrate electrodes,
said substrate electrodes of each said third and fourth MOSFETS being connected to said source electrode of said same MOSFET,
a second output terminal,
said source electrode of said third MOSFET being connected to said first level,
a second output capacitor participating in the establishment of a bias potential and having a first end and a second end and being connected to said second level by said second end.
said drain electrodes of said third and fourth MOSFETS being interconnected at a third junction with said first end of said second output capacitor for providing a charging path for said output capacitor through said third MOSFET and for providing a discharging path for said second output capacitor through said fourth MOSFET,
said gate electrodes of that third and fourth MOSFETS being interconnected to said first junction, and
said source electrode of said fourth MOSFET being connected to said second level whereby, output signals, complementary in form, are available at said first output terminal and said second output terminal.

5. The oscillator as recited in claim 1, and further including:
a capacitor in series connection with said crystal for providing temperature frequency stabilization and frequency trimming.

6. The oscillator as recited in claim 1, and further including:
a capacitor in parallel connection with said crystal for providing frequency trimming.

7. The oscillator as recited in claim 5, and further including:
a capacitor in parallel connection with said crystal for providing frequency trimming.

8. An oscillator circuit as recited in claim 3, and further comprising:
a third N channel, enhancement mode MOSFET having source, drain, gate, and substrate electrodes,
a fourth P channel, enhancement mode MOSFET having source, drain, gate and substrate electrodes,
said substrate electrodes of each of said third and fourth MOSFETS being connected to said source electrode of said same MOSFET,
a second output terminal,
said source electrode of said third MOSFET being connected to said first level,
a second output capacitor participating in the establishment of a bias potential and having a first end and a second end and being connected to said second level by said second end,
said drain electrodes of said third and fourth MOSFETS being interconnected at a third junction with said first end of said second output capacitor for providing a charging path for said output capacitor through said third MOSFET and for providing a discharging path for said second output capacitor through said fourth MOSFETS,
said gate electrodes of that third and fourth MOSFETS being interconnected to said first junction, and
said source electrode of said fourth MOSFET being connected to said second level whereby, output signals, complementary in form, are available at said first output terminal and said second output terminal.

9. An oscillator circuit of the type including complementary metal-oxide semiconductor; field-effect-transistors (MOSFET), comprising:
a source of potential having at least a first level of potential and a second level of potential which is lower than said first level,
a first, enhancement mode, P-channel MOSFET having source, drain, gate, and substrate electrodes,
a second, enhancement mode, N-channel MOSFET having source, drain, gate, and substrate electrodes,
said substrate electrode of each MOSFET being connected to said source electrode of said same MOSFET,
an output terminal,
said source electrode of said first MOSFET being connected to said first level,
an output capacitor participating in the establishment of a bias potential and having a first end and a second end and being connected to said second level by said second end,
said drain electrodes of said first and second MOSFETS being interconnected at a first junction with said first end of said output capacitor for providing a charging path for said output capacitor through said first MOSFET and for providing a discharging path for said output capacitor through said second MOSFET, said gate electrodes being interconnected and forming a second junction, an input capacitor being connected between said second junction and said second level for participating in the establishment of a bias potential for said drain electrodes, said source electrode of said second MOSFET being connected to said second level, a starting resistor is connected between said first and second junctions for ensuring that the interconnected first and second MOSFETS are not initially latched in a static state, a third P channel, enhancement mode MOSFET having source, drain, gate, and substrate electrodes, a fourth N channel, enhancement mode MOSFET having source, drain, gate and substrate electrodes, said substrate electrodes of each said third and fourth MOSFETS being connected to said source electrode of said same MOSFET, a second output terminal, said source electrode of said third MOSFET being connected to said first level, a second output capacitor participating in the establishment of a bias potential and having a first end and a second end and being connected to said second level by said second end, said drain electrodes of said third and fourth MOSFETS being interconnected at a third junction with said first end of said second output capacitor for providing a charging path for said output capacitor through said third MOSFET and for providing a discharging path for said second output capacitor through said fourth MOSFET, said gate electrodes of that third and fourth MOSFETS being interconnected to said first junction, and said source electrode of said fourth MOSFET being connected to said second level, a fifth P channel, enhancement mode MOSFET having source, drain, gate, and substrate electrodes, a sixth N channel, enchancement mode MOSFET having source, drain, gate and substrate electrodes, said substrate electrodes of each of said third and fourth MOSFETS being connected to said source electrode of said same MOSFET, a third output terminal, said source electrode of said fifth MOSFET being connected to said first level, a third output capacitor participating in the establishment of a bias potential and having a first end and a second end and being connected to said second level by said second end, said drain electrodes of said fifth and sixth MOSFETS being interconnected at a fourth junction with said first end of said third output capacitor for providing a charging path for said output capacitor through said fifth MOSFET and for providing a discharging path for said third output capacitor through said sixth MOSFET, said gate electrodes of said fifth and sixth MOSFETS being interconnected to said third junction, said source electrode of said sixth MOSFET being connected to said second level, and a crystal being connected to said fourth junction whereby, output signals, complementary in form, are available at said second and third output terminals.

10. An oscillator circuit of the type including complementary metal-oxide-semiconductor; field-effect-transistors (MOSFET), comprising:

a source of potential having at least a first level of potential and a second level of potential which is greater than said first level, a first, enhancement mode N-channel MOSFET having source, drain, gate, and substrate electrodes, a second, enhancement, P-channel MOSFET having source, drain, gate, and substrate electrodes, said substrate electrode of each MOSFET being connected to said source electrode of said same MOSFET, an output terminal, said source electrode of said first MOSFET being connected to said first level, an output capacitor participating in the establishment of a bias potential and having a first end and a second end and being connected to said second level by said second end, said drain electrodes of said first and second MOSFETS being interconnected at a first junction with said first end of said output capacitor for providing a charging path for said output capacitor through said first MOSFET and for providing a discharging path for said output capacitor through said second MOSFET, said gate electrodes being interconnected and forming a second junction, an input capacitor being connected between said second junction and said second level for participating in the establishment of a bias potential for said drain electrodes, said source electrode of said second MOSFET being connected to said second level, a starting resistor is connected between said first and second junctions for ensuring that the interconnected first and second MOSFETS are not initially latched in a static state, a third N channel, enchancement mode MOSFET having source, drain, gate, and substrate electrodes, a fourth P channel, enhancement mode MOSFET having source, drain, gate and substrate electrodes, said substrate electrodes of each of said third and fourth MOSFETS being connected to said source electrode of said same MOSFET, a second output terminal, said source electrode of said third MOSFET being connected to said first level, a second output capacitor participating in the establishment of a bias potential and having a first end and a second end and being connected to said second level by said second end, said drain electrodes of said third and fourth MOSFETS being interconnected at a third junction with said first end of said second output capacitor for providing a charging path for said output capacitor through said third MOSFET and for providing a discharging path for said second output capacitor through said fourth MOSFET, said gate electrodes of that third and fourth MOSFETS being interconnected to said first junction, and said source electrode of said fourth MOSFET being connected to said second level, a fifth N channel, enhancement mode MOSFET having source, drain, gate, and substrate electrodes, a sixth P channel, enhancement mode MOSFET having source, drain, gate and substrate electrodes, said substrate electrodes of each of said fifth and sixth MOSFETS being connected to said source electrode of said same MOSFET, a third output terminal, said source electrode of said fifth MOSFET being connected to said first level, a third output capacitor participating in the establishment of a bias potential and having a first end and a second end and being connected to said second level by said second end, said drain electrodes of said fifth and sixth MOSFETS being interconnected at a fourth junction with said first end of said third output capacitor for providing a charging path for said output capacitor through said fifth MOSFET and for providing a discharging path for said third output capacitor through said sixth MOSFET, said gate electrodes of said fifth and sixth MOSFETS being interconnected to said third junction, said source electrode of said sixth MOSFET being connected to said second level, and a crystal being connected to said fourth junction whereby, output signals, complementary in form, are available at said second and third output terminals.

* * * * *